United States Patent
Jung

(10) Patent No.: US 8,067,146 B2
(45) Date of Patent: Nov. 29, 2011

(54) METHOD FOR FORMING A FINE PATTERN IN A SEMICONDUTOR DEVICE

(75) Inventor: Jae Chang Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 533 days.

(21) Appl. No.: 11/759,667

(22) Filed: Jun. 7, 2007

(65) Prior Publication Data

US 2008/0166665 A1 Jul. 10, 2008

(30) Foreign Application Priority Data

Jan. 5, 2007 (KR) .................. 10-2007-0001407

(51) Int. Cl.
*G03F 7/20* (2006.01)
(52) U.S. Cl. .................. 430/311; 430/394; 430/961
(58) Field of Classification Search .................. 430/322, 430/311, 394
See application file for complete search history.

(56) References Cited

U.S. PATENT DOCUMENTS

| | | | |
|---|---|---|---|
| 5,976,759 A | 11/1999 | Urano et al. | |
| 6,015,650 A * | 1/2000 | Bae | 430/314 |
| 2003/0027884 A1* | 2/2003 | Kim et al. | 522/81 |
| 2004/0018346 A1* | 1/2004 | Jung et al. | 428/195.1 |
| 2004/0081914 A1* | 4/2004 | Imai et al. | 430/281.1 |
| 2004/0224265 A1* | 11/2004 | Endo et al. | 430/322 |
| 2006/0216649 A1* | 9/2006 | Paxton et al. | 430/311 |
| 2007/0003861 A1 | 1/2007 | Jung et al. | |
| 2007/0281248 A1* | 12/2007 | Levinson et al. | 430/311 |

FOREIGN PATENT DOCUMENTS

| | | |
|---|---|---|
| JP | 2005-003840 | 1/2005 |
| KR | 10-2001-0004081 | 1/2001 |
| KR | 10-2005-0116593 | 12/2005 |
| KR | 10-2006-0116490 | 11/2006 |
| KR | 10-2006-0126213 | 12/2006 |

* cited by examiner

*Primary Examiner* — Kathleen Duda
*Assistant Examiner* — Brittany Raymond
(74) *Attorney, Agent, or Firm* — Marshall, Gerstein & Borun LLP

(57) ABSTRACT

A method for forming a fine pattern a semiconductor device includes the steps of forming a first photoresist pattern over a semiconductor substrate having an underlying layer; coating a pattern hardening coating agent over the first photoresist pattern, thereby forming a pattern hardening film; forming a second photoresist film over the resulting structure; and selectively exposing and developing the second photoresist film, thereby forming a second photoresist pattern to be defined between neighboring first photoresist pattern.

11 Claims, 3 Drawing Sheets

METHOD FOR FORMING A FINE PATTERN IN A SEMICONDUTOR DEVICE

CROSS-REFERENCE TO RELATED APPLICATION

Priority to Korean patent application number 10-2007-0001407, filed on Jan. 5, 2007, the disclosure of which is incorporated by reference in its entirety, is claimed.

BACKGROUND OF THE INVENTION

The invention relates generally to a method for forming a fine pattern in a semiconductor device In order to manufacture smaller semiconductor devices, patterns have become smaller. Research has been directed to developing resists and exposers for obtaining fine patterns.

Regarding exposers, KrF (248 nm) and ArF (193 nm) have been applied as an exposure light source, and attempts have been made to use short wavelength light sources such as $F_2$ (157 nm) or EUV (13 nm; extreme ultraviolet light) or to increase numerical apertures (NA).

However, when new light sources such as $F_2$ are applied, a new exposer is required, and increased manufacturing costs result. Also, the increase of numerical apertures degrades the focus depth width.

Although an immersion lithography process with an immersion solution having a high refractive index has been developed, it is difficult to apply the process on a mass production scale.

Meanwhile, a fine pattern having a resolution beyond the lithography limit has been formed by a double exposure method. However, it is difficult to secure margins of overlapping and arrangement, which results in excessive production cost and time.

SUMMARY OF THE INVENTION

Various embodiments of the invention are directed at providing a method for forming a pattern hardening film over a first photoresist pattern already formed. The method includes hardening a first photoresist pattern, forming a second photoresist film and performing an exposure and developing process to form a second photoresist pattern, thereby obtaining a fine pattern having a pitch finer than the lithography limit.

According to an embodiment of the invention, a method for forming a fine pattern of a semiconductor device includes the steps of: forming a first photoresist pattern over a semiconductor substrate having an underlying layer; coating a pattern hardening coating agent over the first photoresist pattern, thereby forming a pattern hardening film; forming a second photoresist film over the resulting structure; and selectively exposing and developing the second photoresist film, thereby forming a second photoresist pattern to be defined between neighboring first photoresist pattern.

The pattern hardening coating agent preferably includes: an addition copolymer having a repeating unit derived from a fluoro alkyl(methacrylic ester and a repeating unit derived from a glycidyl(meth)acrylic ester a; and an organic solvent. The polymer preferably has a 2,2,3,4,4,4-hexafluorobutyl methacrylate repeating unit and a glycidyl methacrylate repeating unit. The organic solvent can be a higher alcohol solvent having five or more carbon atoms. The coating agent can further include 2-hydroxycyclohexyl p-toluensulfonate.

The pattern hardening coating agent preferably includes the polymer in an amount ranging from 1 to 5 weight parts, based on 100 weight parts of the coating agent.

The step of coating the pattern hardening coating agent preferably includes baking the pattern hardening coating agent at a temperature ranging from 150° C. to 300° C. for 30 seconds to 180 seconds.

The step of forming the first photoresist pattern preferably includes: coating a first photoresist composition over a semiconductor substrate having an underlying layer, thereby forming a first photoresist film; selectively exposing the first photoresist film with an exposure energy ranging from 10 mJ/cm$^2$ to 200 mJ/cm$^2$ using a first exposure mask; post-baking the resulting structure at a temperature ranging from 90° C. to 150° C. for 30 seconds to 180 seconds; and developing the resulting structure.

The step of forming the second photoresist pattern preferably includes selectively exposing the second photoresist film with an exposure energy ranging from 10 mJ/cm$^2$ to 200 mJ/cm$^2$ using a second exposure mask; post-baking the resulting structure at a temperature ranging from 90° C. to 150° C. for 30 seconds to 180 seconds; and developing the resulting structure.

The second exposure mask is preferably same one as the first exposure mask, or it can be an additional exposure mask.

The processes for forming the first and second photoresist patterns are preferably performed with Immersion lithography equipment.

In one embodiment, a pitch between the first photoresist pattern is A, and a pitch between the second photoresist pattern is A/2.

BRIEF DESCRIPTION OF THE DRAWINGS

FIGS. 1a through 1d are cross-sectional diagrams illustrating a method for forming a fine pattern in a semiconductor device according to an embodiment of the invention.

DETAILED DESCRIPTION OF THE SPECIFIC EMBODIMENT

Figure 1A:
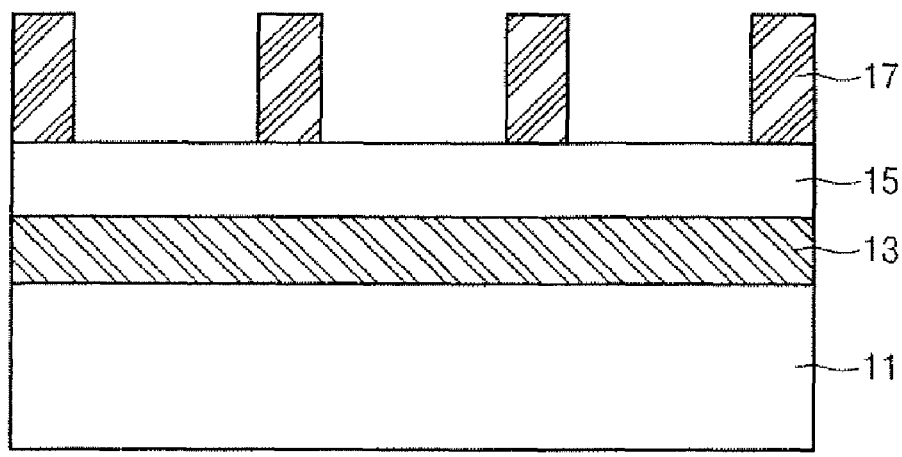
Figure 1B:
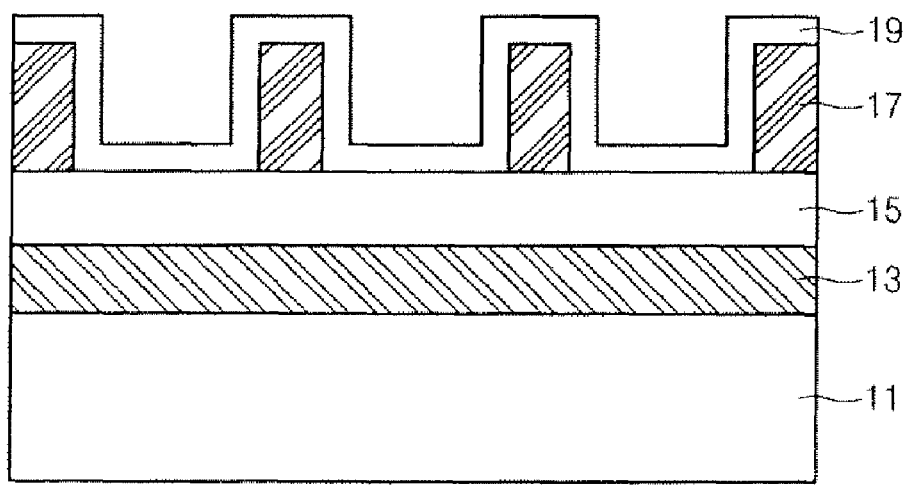

Specific embodiments of the invention is described in detail with reference to the accompanying drawings.

FIGS. 1a through 1d are cross-sectional diagrams illustrating a method for forming a fine pattern in a semiconductor device according to an embodiment of the invention.

A hard mask layer 13 is formed over a semiconductor substrate 11 having an underlying layer which includes a given lower structure. An anti-reflection film 15 is formed over the hard mask layer 13.

A first photoresist composition is coated over the anti-reflection film 15, and then baked at a temperature ranging from 90° C. to 150° C. for 30 seconds to 180 seconds to form a first photoresist film (not shown).

Any suitable chemically amplified photoresist composition can be used as the first photoresist composition in an immersion lithography process.

The first photoresist film is exposed with a first exposure mask having a line pattern of pitch A by an exposure energy ranging from 10 mJ/cm$^2$ to 200 mJ/cm$^2$ using immersion lithography equipment. The light source of the exposure process is selected from the group consisting of G-line (436 nm), i-line (365 nm), KrP (248 nm) ArF (193 nm), $F_2$ (157 nm), and EUV (13 nm).

The resulting structure is post-baked at a temperature ranging from 90° C. to 150° C. for 30 seconds to 180 seconds, and developed with a 2.38 wt % tetramethyl ammonium hydroxide (TMAH) aqueous solution to form a first photoresist pattern 17.

A pattern hardening coating agent is coated over the first photoresist pattern 17, and baked at a temperature from 150° C. to 300° C. for 30 seconds to 180 seconds to form a pattern hardening film 19.

The pattern hardening coating agent includes: an addition copolymer having a repeating unit derived from a fluoro alkyl(meth)acrylic ester and a repeating unit derived from a glycidyl(meth)acrylic ester, and an organic solvent.

It is preferable that the polymer includes a 2,2,3,4,4,4-hexafluorobutyl methacrylate repeating unit and a glycidyl methacrylate repeating unit.

The repeating unit derived from a fluoro alkyl(meth)acrylic ester dissolves a higher alcohol solvent, and the repeating unit derived from a glycidyl(meth)acrylic ester serves as a cross-linking agent.

The polymer is present in an amount ranging from 1 to 5 weight parts, based on 100 weight parts of the coating agent. The cross-linking reaction does not occur sufficiently when the polymer is present in the amount of less than 1 weight part, and the critical dimension CD of photoresist becomes larger when the polymer is present in the amount of over 5 weight parts.

The organic solvent is one or more selected from the group consisting of higher alcohol solvents having five or more carbon atoms such as n-pentanol and 4-methyl-2-pentanol. The first photoresist pattern 17 is not dissolved even when coated by the pattern hardening coating agent. The organic solvent can be the balance of the coating agent.

The pattern hardening coating agent may further include 2-hydroxycyclohexyl p-toluenesulfonate as a in cross-linking catalyst.

A second photoresist composition is coated over the resulting structure, and then baked at a temperature ranging from 90° C. to 150° C. for 30 seconds to 180 seconds to form a second photoresist film 21.

Any suitable chemically amplified photoresist composition can be used as the second photoresist composition in the immersion lithography process.

Although the second photoresist composition is coated, the first photoresist pattern 17 is hardened by the pattern hardening film 19 so that the pattern 17 is not changed by the second photoresist composition.

The second photoresist film 21 is exposed with a second exposure mask having a line pattern of pitch A by an exposure energy ranging from 10 mJ/cm$^2$ to 200 mJ/cm$^2$ using immersion lithography equipment.

The second exposure mask can be the first exposure mask displaced a specified distance, or it can be an additional exposure mask.

The resulting structure is post-baked at a temperature ranging from 90° C. to 150° C. for 30 seconds to 180 seconds, and developed with a 2.38 wt % TMAH aqueous solution to form a second photoresist pattern 23 having individual elements between individual elements of the adjacent first photoresist pattern 17. Both the first and second photoresist patterns 17, 23 have a pitch A that is the minimum size limit of the lithography process. The staggered arrangement of the first and second photoresist patterns 17, 23 results in a composite photoresist pattern having a reduced pitch A/2 (i.e., a pitch smaller than the lithography limit).

The second photoresist pattern 23 can be formed between the first photoresist pattern 17 because its original shape is preserved by the pattern hardening film even after the exposure and developing process.

According to another embodiment of the invention, the method steps represented by FIGS. 1a through 1d are repeated at least two or more times, thereby obtaining an even finer pattern.

EXAMPLE 1

Preparation of a Pattern Hardening Coating Agent Polymer

Figure 2:
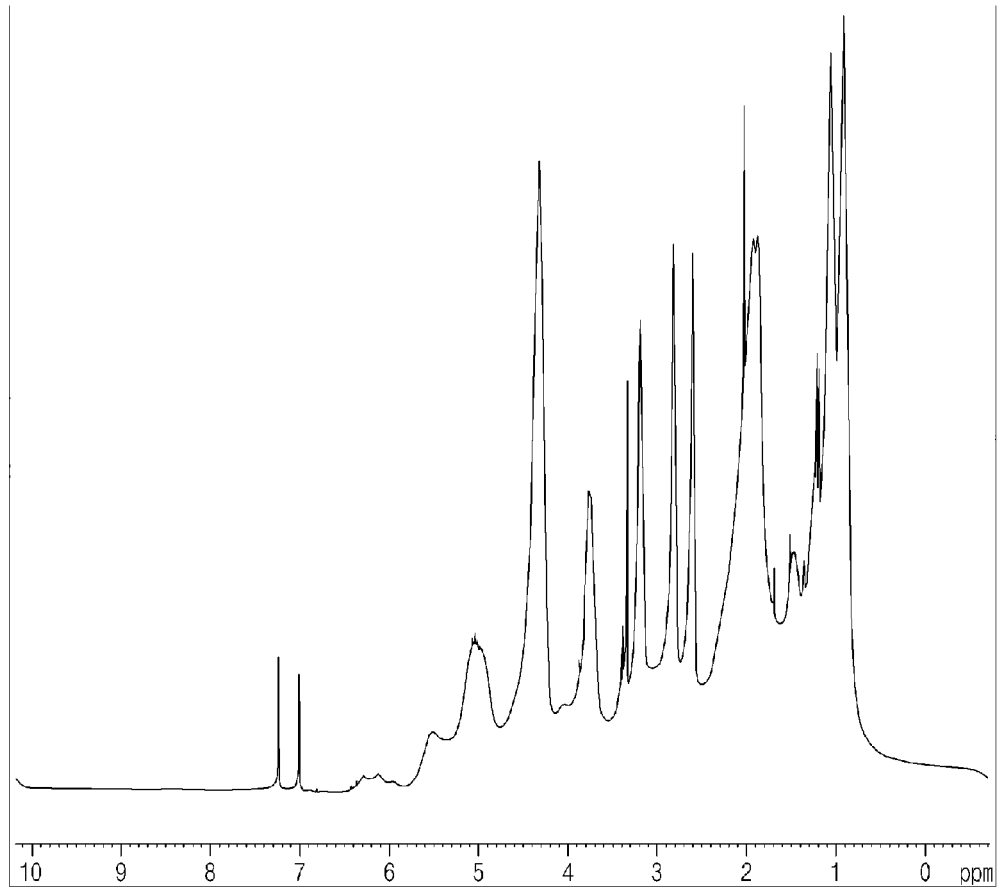
FIG. 2 is an NMR spectrum of a pattern hardening coating agent polymer obtained from Example 1.

To a round flask (250 mL) were added 2,2,3,4,4,4-hexafluorobutyl methacrylate (13.2 g), glycidyl methacrylate (8 g), azobisisobutyronitrile (AIBN) (0.4 g) as a polymerization initiator, and propylenegylcol methyl ether acetate (PGMEA) (100 g). The resulting mixture was reacted under a nitrogen atmosphere for 8 hours. After reaction, the resulting polymer was precipitated in n-hexane (1000 mL) and dehydrated in a vacuum to obtain a pattern hardening coating agent polymer according to the invention (yield: 91%). FIG. 2 is an NMR spectrum of the resulting polymer.

EXAMPLE 2

Preparation of a Pattern Hardening Coating Agent

In n-pentanol (500 g) were dissolved the pattern hardening coating agent polymer (10 g) obtained from Example 1 and 2-hydroxycyclohexyl p-toluensulfonate (0.3 g) to obtain a pattern hardening coating agent according to the invention.

EXAMPLE 3

Formation of a Fine Pattern

Formation of a First Photoresist Pattern

An immersion photoresist composition DHAI102 (produced by Dongjin Chemical Co.) was coated over a wafer, and pre-baked at 100° C. for 60 seconds to form a first photoresist film. The first photoresist film was exposed with a mask having an 80 nm half pitch by an exposure energy of 37 mJ/cm$^2$ using immersion lithography equipment. The resulting structure was post-baked at 100° C. for 60 seconds, and developed with a 2.38 wt % TMAH aqueous solution, thereby obtaining a 30 nm first photoresist pattern.

Formation of a Pattern Hardening Film

The pattern hardening coating agent obtained from Example 2 was coated over the first photoresist pattern, and pre-baked at 170° C. for 90 seconds to obtain a pattern hardening film so that the first photoresist pattern increases to 40 nm.

Formation of a Second Photoresist Pattern

An AIM5076 photoresist composition (produced by JSR Co.) was coated over the above resulting structure, and pre-baked at 100° C. for 60 seconds to form a second photoresist film. The second photoresist film was exposed with a mask having an 80 nm half pitch by an exposure energy of 38 mJ/cm$^2$ using immersion lithography equipment. The resulting structure was post-baked at 100° C. for 60 seconds, and developed with a 2.38 wt % TMAH aqueous solution, thereby obtaining a 40 nm second photoresist pattern.

Figure 3:
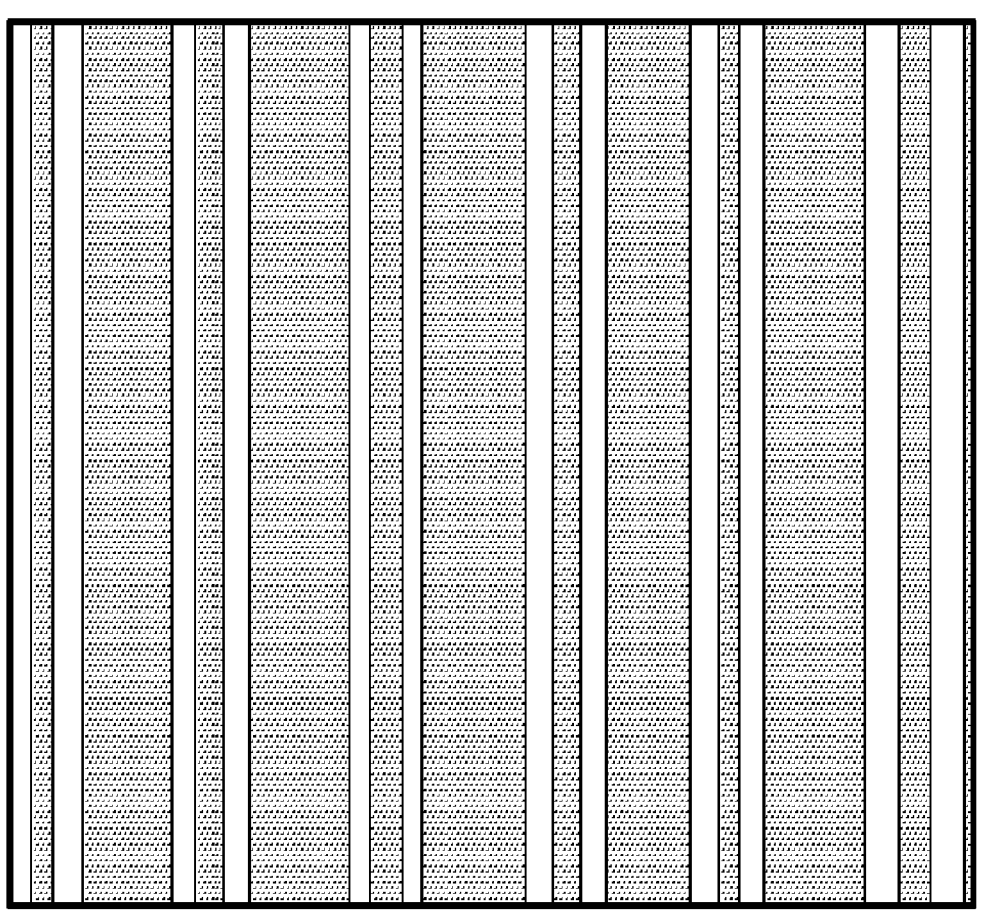
FIG. 3 is an illustration of a fine pattern obtained from Example 3.

Since the elements of the second photoresist pattern were formed between adjacent elements of the first photoresist pattern, the resulting composite pattern was formed to have a 40 nm half pitch with a mask having a 80 nm half pitch (see FIG. 3). The mask used in the second exposure process was the same mask used in the first exposure process, although it was shifted a specified distance in between the two exposure processes.

As described above, in a method for forming a fine pattern of a semiconductor device according to an embodiment of the invention, a pattern hardening film is formed over a first photoresist pattern which has been already formed. In other words, a first photoresist pattern is hardened, and a second photoresist film is formed. An exposure and developing process is performed to form a second photoresist pattern, thereby obtaining a fine pattern having a pitch finer than the a lithography limit. Furthermore, the above method can be repeated several times to obtain an even finer pattern.

The above embodiments of the invention are illustrative and not limiting. Various alternatives and equivalents are possible. The invention is not limited by the lithography steps described herein. Nor is the invention limited to any specific type of semiconductor device. For example, the invention may be implemented in a dynamic random access memory (DRAM) device or a non-volatile memory device. Other additions, subtractions, or modifications that are obvious in view of the present disclosure and are intended to fall within the scope of the appended claims.

What is claimed is:

1. A method for forming a fine pattern in a semiconductor device, the method comprising the steps of:
    forming first photoresist patterns over a semiconductor substrate having an underlying layer;
    coating a pattern hardening coating agent over the first photoresist patterns, and then baking the pattern hardening coating agent at a temperature ranging from 150° C. to 300° C.,
    wherein the hardening coating agent comprises an addition polymer consisting of a 2,2,3,4,4,4-hexafluorobutyl methacrylate repeating unit and a glycidyl methacrylate repeating unit, an organic solvent, and 2-hydroxycyclohexyl p-toluenesulfonate, to form a pattern hardening film;
    forming a second photoresist film over the pattern hardening film; and
    selectively exposing and developing the second photoresist film, thereby forming a second photoresist pattern to be defined between neighboring first photoresist patterns.

2. The method according to claim 1, wherein the organic solvent comprises an alcohol having five or more carbon atoms.

3. The method according to claim 1, wherein the pattern hardening coating agent comprises the copolymer in an amount ranging from 1 to 5 weight parts, based on 100 weight parts of the coating agent.

4. The method according to claim 1, wherein the step of baking the pattern hardening coating agent is performed for 30 seconds to 180 seconds.

5. The method according to claim 1, wherein the step of forming the first photoresist pattern comprises:
    coating a first photoresist composition over the semiconductor substrate, thereby forming a first photoresist film;
    selectively exposing the first photoresist film with an exposure energy ranging from 10 mJ/cm$^2$ to 200 mJ/cm$^2$ using a first exposure mask;
    post-baking the exposed photoresist film at a temperature ranging from 90° C. to 150° C. for 30 seconds to 180 seconds; and
    developing the baked photoresist film.

6. The method according to claim 5, wherein the step of forming the second photoresist pattern comprises:
    selectively exposing the second photoresist film with an exposure energy ranging from 10 mJ/cm$^2$ to 200 mJ/cm$^2$ using a second exposure mask;
    post-baking the exposed photoresist film at a temperature ranging from 90° C. to 150° C. for 30 seconds to 180 seconds; and
    developing the baked photoresist film.

7. The method according to claim 6, wherein the second exposure mask is the same as the first exposure mask.

8. The method according to claim 6, wherein the second exposure mask is different from the first exposure mask.

9. The method according to claim 1, wherein the step of forming the first photoresist pattern is performed using immersion lithography equipment.

10. The method according to claim 1, wherein the step of exposing and developing the second photoresist film is performed using immersion lithography equipment.

11. The method according to claim 1, wherein a pitch between the first photoresist patterns is A, and a pitch between the first photoresist pattern and the second photoresist pattern is A/2.

* * * * *